US010988359B2

(12) United States Patent
Tanaka

(10) Patent No.: US 10,988,359 B2
(45) Date of Patent: Apr. 27, 2021

(54) OVERHEAD TRANSPORT VEHICLE AND TRANSPORT SYSTEM

(71) Applicant: MURATA MACHINERY, LTD., Kyoto (JP)

(72) Inventor: Hiroshi Tanaka, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/339,731

(22) PCT Filed: Sep. 19, 2017

(86) PCT No.: PCT/JP2017/033697
§ 371 (c)(1),
(2) Date: Apr. 5, 2019

(87) PCT Pub. No.: WO2018/074130
PCT Pub. Date: Apr. 26, 2018

(65) Prior Publication Data
US 2020/0047998 A1 Feb. 13, 2020

(30) Foreign Application Priority Data

Oct. 18, 2016 (JP) .............................. JP2016-204185

(51) Int. Cl.
*B66F 9/08* (2006.01)
*H01L 21/677* (2006.01)
(Continued)

(52) U.S. Cl.
CPC .............. *B66F 9/08* (2013.01); *B65G 1/0407* (2013.01); *B66F 9/07* (2013.01); *H01L 21/6773* (2013.01);
(Continued)

(58) Field of Classification Search
CPC ................ B65G 1/0407; B65G 1/0464; B65G 2201/0297; B66F 9/08; H01L 21/6773; H01L 21/67733
See application file for complete search history.

(56) References Cited

U.S. PATENT DOCUMENTS 3,445,010 A * 5/1969 Alstedt ................ B65G 1/0442
414/282
4,005,786 A * 2/1977 Adelson ............... B65G 1/0464
414/281
(Continued)

FOREIGN PATENT DOCUMENTS

JP 6-48513 A 2/1994
WO 2016/031352 A1 3/2016

OTHER PUBLICATIONS

Official Communication issued in International Patent Application No. PCT/JP2017/033697, dated Apr. 23, 2019.
(Continued)

*Primary Examiner* — James Keenan
(74) *Attorney, Agent, or Firm* — Keating & Bennett, LLP

(57) ABSTRACT

An overhead transport vehicle includes a traveling body that travels on a track on a ceiling of a facility, an upper mast attached to a lower side of the traveling body and including an upper guide, an elevation platform on which an article is placed, and which is guided by the upper guide to ascend or descend along the upper mast, and a lift driver that is provided on the traveling body or on the elevation platform and that drives the elevation platform to ascend or descend. A lower mast is connected to the lower end of the upper mast via a connector in a freely detachable manner and includes a lower guide extending to the upper guide. The elevation platform is able to be lowered along the lower mast from the upper mast by the lift driver.

12 Claims, 12 Drawing Sheets

(51) Int. Cl.
    *B65G 1/04*     (2006.01)
    *B66F 9/07*     (2006.01)
    *B07C 5/36*     (2006.01)
    *B08B 5/02*     (2006.01)
    *B65G 1/10*     (2006.01)

(52) U.S. Cl.
    CPC .......... *H01L 21/67733* (2013.01); *B07C 5/36* (2013.01); *B08B 5/023* (2013.01); *B65G 1/0428* (2013.01); *B65G 1/0492* (2013.01); *B65G 1/10* (2013.01); *B65G 2201/0297* (2013.01)

(56) References Cited

U.S. PATENT DOCUMENTS

| | | | | |
|---|---|---|---|---|
| 5,980,183 | A * | 11/1999 | Fosnight | ........... H01L 21/67727 414/222.01 |
| 6,677,690 | B2 * | 1/2004 | Fosnight | ........... H01L 21/67242 307/326 |
| 7,762,754 | B2 * | 7/2010 | Maetaki | ................... B66C 1/36 414/281 |
| 2014/0003894 | A1 | 1/2014 | Takahara et al. | |
| 2015/0020343 | A1 | 1/2015 | Shibata et al. | |
| 2017/0217681 | A1 | 8/2017 | Tai | |
| 2019/0241415 | A1 * | 8/2019 | Tanaka | ................... B65G 1/023 |

OTHER PUBLICATIONS

Official Communication issued in International Patent Application No. PCT/JP2017/033697, dated Dec. 12, 2017.

\* cited by examiner

OVERHEAD TRANSPORT VEHICLE AND TRANSPORT SYSTEM

BACKGROUND OF THE INVENTION

1. Field of the Invention

The present invention relates to an overhead transport vehicle and a transport system.

2. Description of the Related Art

In an automated warehouse or in an intra-bay facility or the like where a processing apparatus is arranged therein, a stacker crane or the like is used for transferring articles (for example, refer to Japanese Patent No. 5545498). The stacker crane of Japanese Patent No. 5545498 includes a traveling body that travels and moves while being guided by a floor side track, a plurality of masts erected on the traveling body, a guided part that is guided by a ceiling side track, and an elevation platform that ascends or descends along the masts.

In the stacker crane of Japanese Patent No. 5545498, a lower portion and an upper portion of the masts can be freely separated from or connected to each other. When a maintenance work is carried out, the masts are separated into a lower portion and an upper portion in some cases. Elevation belts that suspend the elevation platform are arranged over the upper side and the lower side of the masts, and are detached from the stacker crane before the masts are separated. The elevation belts are pulled out, after both end portions of the elevation belts are detached from the elevation platform, in the state of supporting the elevation platform. Thereafter, the elevation platform is lowered and then the masts are separated into the lower portion and the upper portion.

The stacker crane of Japanese Patent No. 5545498 separates the upper side structure and the lower side structure at the time of carrying out maintenance work or the like by separating the masts, and the separated upper side structure or the separated lower side structure is transported to another location in some cases. However, the stacker crane of Japanese Patent No. 5545498 has a problem. The stacker crane, when separating the masts, requires troublesome work such as an operation of removing the elevating belts from the masts, which not only is time consuming but also prolongs the time of interruption in article transportation, resulting in reduced transport efficiency. Further, the separated upper structure does not have a function of raising or lowering the elevation platform and is incapable of transporting articles.

SUMMARY OF THE INVENTION

In view of the above problem, preferred embodiments of the present invention provide overhead transport vehicles and transport systems capable of separating a mast into an upper mast and a lower mast easily to reduce the amount of time required for the separation thereof, and allowing a traveling body to travel in the state of consolidating, on the upper mast, all of elements required to raise or lower an elevation platform after separating the lower mast.

An overhead transport vehicle according to a preferred embodiment of the present invention includes a traveling body that travels on a track provided on a ceiling side of a facility, an upper mast attached to a lower side of the traveling body and including an upper guide, an elevation platform on which an article is placed, and which is guided by the upper guide to ascend or descend along the upper mast, and a lift driver that is provided on the traveling body or on the elevation platform and that drives the elevation platform to ascend or descend, the overhead transport vehicle further including a lower mast that is connected to the lower end of the upper mast via a connector in a freely detachable manner, that includes a lower guide that extends to the upper guide, wherein the elevation platform is able to be lowered along the lower mast from the upper mast by the lift driver.

A lower end position of the upper mast may be set lower than a lower end of the elevation platform positioned at an upper limit of a movable range thereof. The lower mast connected to the upper mast and a member attached to the lower mast may not be in contact with a floor surface side of the facility when the traveling body is traveling. The elevation platform may include a plurality of mast guides for the elevation platform to ascend or descend along the upper mast or the lower mast. The overhead transport vehicle may further include a transferor that is provided on the elevation platform and that transfers the article.

A transport system according to a preferred embodiment of the present invention includes the overhead transport vehicle described above, and the track on which the overhead transport vehicle travels.

The transport system may further include a support that supports the lower mast when disconnected from the upper mast. The transport system may further include a lifter that is able to be connected to the track and that causes the overhead transport vehicle having been disconnected from the lower mast to move in a vertical direction. The transport system may further include a second lower mast that is connected to the lower end of the upper mast via a connector in a freely detachable manner, that includes a lower guide extending to the upper guide, and that has a length different from that of the lower mast.

An overhead transport vehicle according to a preferred embodiment of the present invention is capable of easily expanding an ascending/descending range of the elevation platform by connecting the lower mast to the upper mast. The lift driver is supported by the traveling body even when the lower mast is separated from the upper mast. Therefore, an upper structure and a lower structure are able to be separated by a simple operation such as removal of the lower mast from the upper mast. Since the upper mast, the elevation platform, and the lift driver are supported in a compact form by the traveling body, the upper mast, the elevation platform, and the lift driver are able to be easily moved to another location along with the traveling body after the upper mast has been separated from the lower mast. In other words, the traveling body is able to travel in the state of consolidating, on the upper mast (in the upper structure), all of the elements required to raise and lower the elevation platform. Also, the elevation platform is able to be raised or lowered along the upper mast after the lower mast has been separated from the upper mast.

In the example where the lower end position of the upper mast is set lower than the lower end of the elevation platform positioned at an upper limit of a movable range thereof, the lower portion of the elevation platform does not project to the lower side of the upper mast when the elevation platform is positioned at the upper limit of the movable range thereof. Therefore, when the traveling body is moved after having separated the upper mast from the lower mast, it is possible to avoid interference of the lower portion of the elevation platform with other portions. In the example where the lower mast connected to the upper mast and a member attached to the lower mast are not in contact with the floor surface side of the facility when the traveling body is traveling, the lower structure including the lower mast is not in contact with the floor surface, and therefore, the traveling load of the overhead transport vehicle is able to be reduced.

In the example where the elevation platform includes the plurality of mast guides for the elevation platform to ascend or descend along the upper mast or the lower mast, the elevation platform is able to be smoothly raised or lowered along the upper mast or the lower mast. In the example where the overhead transport vehicle further includes the transferor that is provided on the elevation platform and that transfers the article, the transfer device is able to easily transfer the article to a transfer destination.

Since a transport system according to a preferred embodiment of the present invention uses the overhead transport vehicle mentioned above, the overhead transport vehicle can be used in a mode selected from two modes, namely the state of having the upper mast only and the state of having the lower mast connected, and as a result, transport mode versatility of the overhead transport vehicle is improved. In the example where the transport system further includes the support that supports the lower mast when disconnected from the upper mast, the support is able to prevent the lower mast having been separated from the upper mast, from falling down.

In the example where the transport system further includes the lifter that is able to be connected to the track and that causes the overhead transport vehicle having been disconnected from the lower mast to move in the vertical direction, the overhead transport vehicle that has separated the lower mast therefrom is able to easily be raised or lowered by the lifter between the track and a maintenance position on the lower side thereof, or between the track and another track on the lower side thereof. In the example where the transport system further includes the second lower mast that is connected to the lower end of the upper mast via a connector in the freely detachable manner, that includes a lower guide that extends to the upper guide, and that has a length that is different from that of the lower mast, the ascending/descending range of the elevation platform is able to be easily changed by connecting the upper mast to the second lower mast.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes preferred embodiments of the present invention with reference to the drawings. In the following drawings, an XYZ coordinate system is used to describe the directions in each drawing. In the XYZ coordinate system, the vertical direction is taken as the Z direction, and the horizontal directions are taken as the X direction and the Y direction. The X direction is, for example, a traveling direction of a traveling body described later, and the Y direction is, for example, a transfer direction of a transferor described later. Also, in each of the X, Y, and Z directions, where appropriate, the direction indicated by the arrow is expressed as a + direction (for example, +X direction), and the direction opposite thereof is expressed as a − direction (for example, −X direction).

First Preferred Embodiment

Figure 1A:
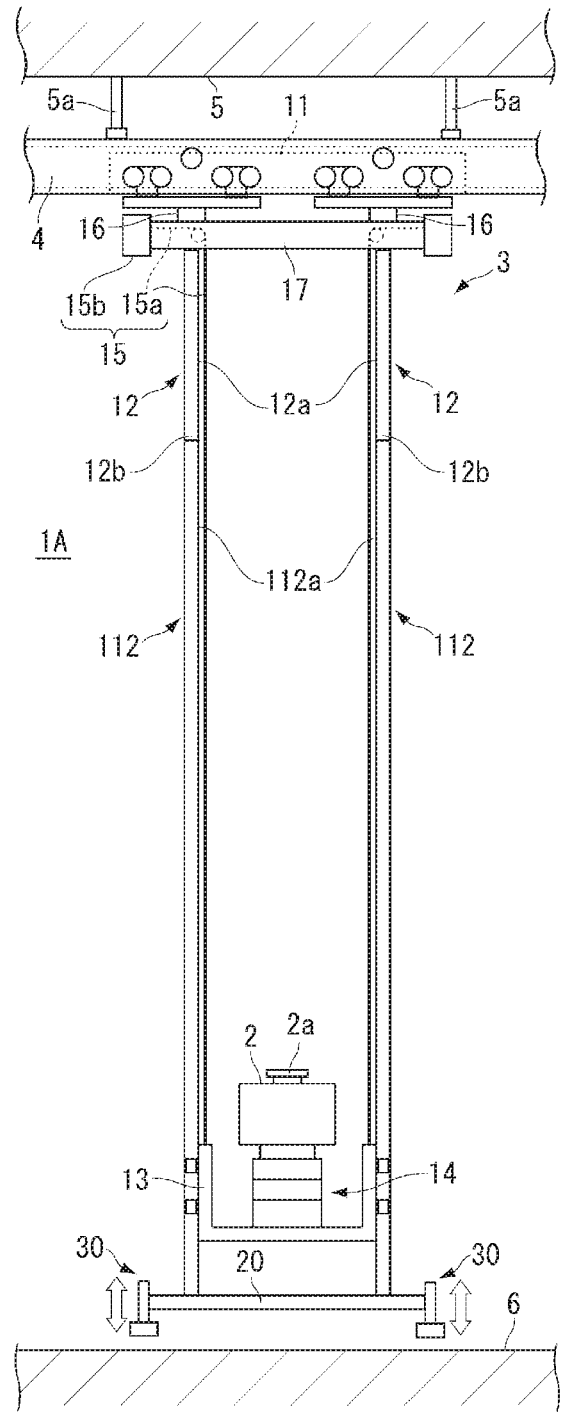
FIGS. 1A and 1B show examples of an overhead transport vehicle and a transport system related to a first preferred embodiment of the present invention, FIG. 1A being a diagram viewed from the Y direction, and FIG. 1B being a diagram viewed from the X direction.
Figure 1B:
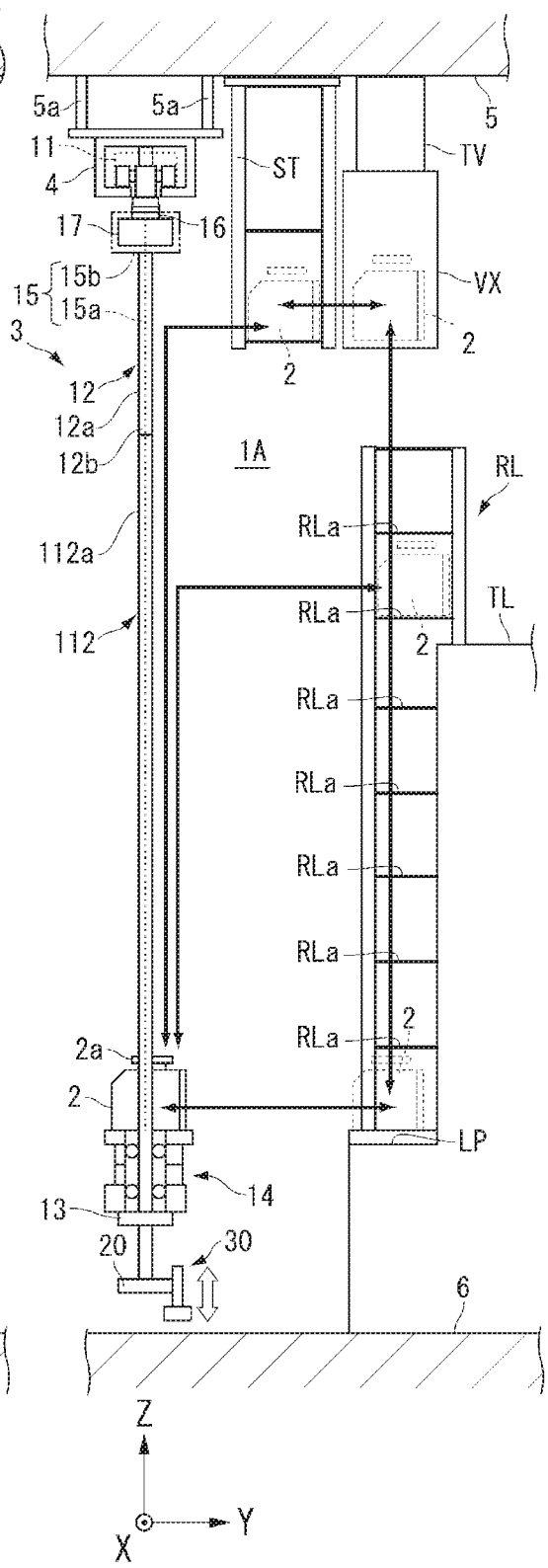

FIGS. 1A and 1B are diagrams showing examples of a transport system to which an overhead transport vehicle related to the present preferred embodiment is applied. A transport system 1A of the present preferred embodiment preferably is installed in a semiconductor device manufacturing factory, for example, and is applied to a system that transports articles 2 such as FOUPs (Front Opening Unified Pods) accommodating semiconductor wafers used for manufacturing semiconductor devices, and reticle pods accommodating processing members such as reticles, for example. Here, the article 2 is described as a FOUP, however, the article 2 need not be a FOUP. Also, the transport system 1A can be applied to a facility of a field other than the semiconductor field, and the articles 2 may be various kinds of articles handled at a facility having the transport system 1A installed therein.

The transport system 1A includes an overhead transport vehicle 3 and a track 4. In the present preferred embodiment, as an example, the track 4 is a traveling rail and is provided in a state of being suspended from a ceiling 5 of the facility by a plurality of metal hangers 5*a*. The overhead transport vehicle 3 travels along the track 4 and transfers the articles 2 to transfer destinations. As an example, in this preferred embodiment, a transfer destination or a transfer origin of the article 2 is a load port LP of a processing apparatus TL, a stocker (a storage, or an automated warehouse), a storage rack RL provided in the processing apparatus, or a buffer ST.

The processing apparatus TL is, for example, an exposer, a coater/developer, a film former, or an etcher, and performs various processes on a semiconductor wafer accommodated in the article 2 transported by the transport system 1A. The stocker mentioned above stores the article 2 transported by the transport system 1A.

The buffer ST is mentioned above as a side track buffer (STB), however, it may be an under track buffer (UTB), and is provided along a track TV, in a state of being suspended from the ceiling 5. The buffer ST temporarily stores the article 2 transported by the overhead traveling vehicle VX provided in the transport system 1A. The overhead traveling vehicle VX is, for example, an OHT (Overhead Hoist Transport), an OHV (Overhead Hoist Vehicle), or the like. The overhead traveling vehicle VX travels along the track TV provided on the ceiling 5. The track TV may be of the same standard as that of the track 4 and may have a point of merging with or a point of branching from the track 4. A portion or all of the track TV may be in common with that of the track 4.

As an example, the overhead traveling vehicle VX of the present preferred embodiment includes a hoist (not shown in the drawings), the article 2 is delivered to or received from the load port LP of the processing apparatus TL by raising or lowering the article 2 using the hoist. The overhead traveling vehicle VX laterally projects the hoist in a lateral direction of the track 4 and raises or lowers the article 2 to deliver or receive the article 2 to or from the storage rack RL. One or both of the storage rack RL and the buffer ST described above may be included in the configuration of the transportation system 1A or may be included in a facility such as a factory where the transport system 1A is installed. The overhead traveling vehicle VX may be included in the configuration of the transport system 1A or may be included in a configuration of a transport system separate from the transport system 1A.

The overhead transport vehicle 3 includes a traveling body 11, upper masts 12, an elevation platform 13, a transferor 14, and lift drivers 15. The traveling body 11 travels along the track 4. A traveling direction of the traveling body 11 is a direction parallel or substantially parallel to the track 4 (in the X direction in FIGS. 1A and 1B). The traveling body 11 includes a traveling driver not shown in the drawings such as an electric motor, a speed reducer, an encoder, and so forth. Moreover, the traveling body 11 includes a driving wheel and a driven wheel. The driving wheel is mounted so as to be pressed against an inner upper surface of the track 4 by the elastic force of an elastic member such as a coil spring and is connected to an output axis of the electric motor via the speed reducer. The rotation of the output axis of the electric motor is transmitted to the drive wheel via the speed reducer, and the rotation of the drive wheel drives the traveling body 11 to travel. The driven wheel includes a caster, and the caster is able to rotate about a vertical (a z direction) axis of the caster and be in contact with an inner lower surface of the track 4. The encoder detects the rotation speed of the output axis of the electric motor and outputs the result of the detection to a controller (not shown in the drawings). The controller controls rotation of the electric motor based on the detection result of the encoder and controls the speed or the stop position of the traveling body 11. The setting of the stop position of the traveling body 11 may be performed by identifying an indicator plate or the like that is preliminarily installed along the track 4. Other than an electric motor, a linear motor or the like may also be used for the traveling driver.

The upper masts 12 are attached to a lower side of the traveling body 11. In FIGS. 1A and 1B, a rotation axis 16 is provided below the traveling body 11, and an upper support body 17 is attached below the rotation axis 16. The upper masts 12 are attached to the upper support body 17. The upper masts 12 are suspended from the traveling body 11. The upper masts 12 are provided respectively on both sides (on a +X direction (a positive X direction) side, and on a −X direction (a negative X direction) side) of a traveling direction (the X direction) of the traveling body 11. For attachment of the upper masts 12 to the upper support body 17, fastening members such as bolts and nuts may be used or welding or the like may be used, for example.

Each upper mast 12 includes an upper guide 12*a* that guides the elevation platform 13 described later and a connector 12*b* to connect to a lower mast 112 described later. A circumferential surface of the upper mast 12 may be used for the upper guide 12*a*, or, for example, the upper guide 12*a* may be a groove along a longitudinal direction of the upper mast 12. The connector 12*b* is provided at a lower end portion of the upper mast 12. The connector 12*b* of the upper mast 12 and an upper end portion of the lower mast 112 are connected in a freely detachable manner.

A cross section of each lower mast 112 in a direction orthogonal to the longitudinal direction is the same or substantially the same as that of the upper mast 12, and in this preferred embodiment, as an example, the lower mast 112 is longer than the upper mast 12. Each lower mast 112 includes a lower guide 112*a* extending to the upper guide 12*a* when connected to the upper mast 12. A circumferential surface of the lower mast 112 may be used for the upper guide 112*a*, or, for example, the lower guide 12*a* may be a groove along a longitudinal direction of the lower mast 112. Each lower guide 112*a* preferably extends continuously to the upper guide 12*a*. That is to say, when the upper guide 12*a* is the circumferential surface of the upper mast 12, the circumferential surface is used as the lower guide 112*a* and is provided so as to continue to the upper guide 12*a*. This causes the elevation platform 13 described later able to descend from the upper masts 12 down to the lower masts 112 and also to ascend from the lower masts 112 up to the upper masts 12.

The connector 12*b* of each upper mast 12 and the upper end portion of each lower mast 112 are combined by, for example, inserting one into the other as in a spigot structure, and the upper mast 12 and the lower mast 112 are connected by fixing them, in the state of being combined, in the horizontal direction orthogonal to the vertical direction (the Z direction) by a pin or a fixing screw. By removing the pin or the fixing screw, the lower mast 112 is able to be separated in the vertical direction from the connector 12*b* of the upper mast 12. The separation between the upper mast 12 and the lower mast 112 will be described later with reference to FIG. 3. The mode may be such that the cross-sectional shape of the upper mast 12 and the cross-sectional shape of the lower mast 112 may be different. Even in such a mode, the lower guide 112*a* preferably extends continuously to the upper guide 12*a* when the lower mast 112 is connected to the connector 12*b*.

The connection structure between the connector 12b of the upper mast 12 and the upper end portion of the lower mast 112 (the connection structure established by the pin or the fixing screw) is not limited to the above example, and other structures may be used. For example, one of the connector 12b and the upper end portion of the lower mast 112 may have a hook provided therein and the other may have a locking pin provided therein. In this configuration, the lower mast 112 is fixed to the connector 12b by hooking the hook on the locking pin, and the lower mast 112 is able to be separated from the connector 12b by removing the hook from the locking pin. Separation or connection of the lower mast 112 with respect to the connector 12b may be performed manually by an operator (through a manual operation), or may be automatically performed using an actuator or the like.

The lower ends of lower masts 112 are connected to a lower support body 20. The lower support body 20 is connected to the lower mast 112 on the +X side and the lower mast 112 on the −X side, respectively. The lower support body 20 is, for example, of a plate shape.

When the traveling body 11 accelerates in the traveling direction (when traveling is started from a stopped state, for example), the lower portion of the lower mast 112 cannot follow and stay below the traveling body 11 due to the inertial force, and this causes a delay to occur. The delay of the lower portion of the lower mast 112 is able to be eliminated by, for example, the traveling driver not shown in the drawings temporarily reducing the acceleration of the traveler 11, or by repeating such acceleration reduction several times.

When the traveling body 11 decelerates in the traveling direction (for example, when stopping from the traveling state), the lower portion of the lower mast 112 precedes to the forward side from the lower side of the traveling body 11 due to the inertial force, and this causes a delay to occur. Such preceding of the lower portion of the lower mast 112 is able to be eliminated by, for example, the traveling driver not shown in the drawings temporarily increasing the acceleration of the traveler 11 or by repeating such acceleration increase several times during deceleration of the traveling body 11 or before the traveling body 11 starts to decelerate.

Since the inertial force acting on the lower support body 20 side causes the upper mast 12 and the lower mast 112 to vibrate or oscillate in the traveling direction (the X direction) when the traveling body 11 is accelerating or decelerating, the overhead transport vehicle 3 may include a damper that damps vibrations or oscillation of the upper mast 12 and the lower mast 112. The damper suppresses or prevents vibrations and so forth of the upper mast 12 and so forth.

The elevation platform 13 carries the article 2 placed thereon via a transferor 14 described later, and ascends or descends along the upper masts 12 and the lower masts 112 while being guided by the upper guides 12a of the upper masts 12 or the lower guides 112a of the lower masts 112. It has been mentioned that the elevation platform 13 can be lowered from the upper masts 12 down to lower masts 112 and can be raised from the lower masts 112 up to the upper masts 12. The elevation platform 13 is located between the upper mast 12 (the lower mast 112) on the +X side and the upper mast 12 (lower mast 112) on the −X side. The elevation platform 13 is structured, for example, such that side portions thereof are fixed respectively on both end sides of the bottom part of the traveling body 11 in the traveling direction. The transferor 14 is mounted on the upper surface of the elevation platform 13.

The lift drivers 15 cause the elevation platform 13 to ascend or descend along the upper masts 12 or the lower masts 112. Each lift driver 15 includes a suspender 15a and a lift driver 15b. As an example of the present preferred embodiment, the suspender 15a is a belt or a wire. The elevation platform 13 is suspended from the upper support body 17 by the suspenders. The lift drivers 15b are provided on the upper support body 17 and each feed out or wind up the suspender 15a. When the lift drivers 15b feed out the suspenders, the elevation platform 13 is lowered while being guided by the upper masts 12 or the lower masts 112. When the lift drivers 15b wind up the suspenders 15a, the elevation platform 13 is raised while being guided by the upper masts 12 or the lower masts 112.

The lift driver 15 is provided on the upper support body (that is, the traveling body 11), but is not limited thereto. As another example of the present preferred embodiment, the lift driver 15 may be provided on the elevation platform 13. As a configuration of providing the lift driver 15 on the elevation platform 13, the elevation platform 13 may be raised or lowered by winding up or feeding out the belt or wire suspended from the upper support body 17 by a device (such as a hoist) mounted on the elevation platform 13. Also, the elevation platform 13 may be raised or lowered by mounting an electric motor or the like that drives a pinion gear, forming, on the upper mast 12 or the lower mast 112, a rack that meshes with the pinion gear, and driving the electric motor and so forth to rotate the pinion gear.

Figure 2A:
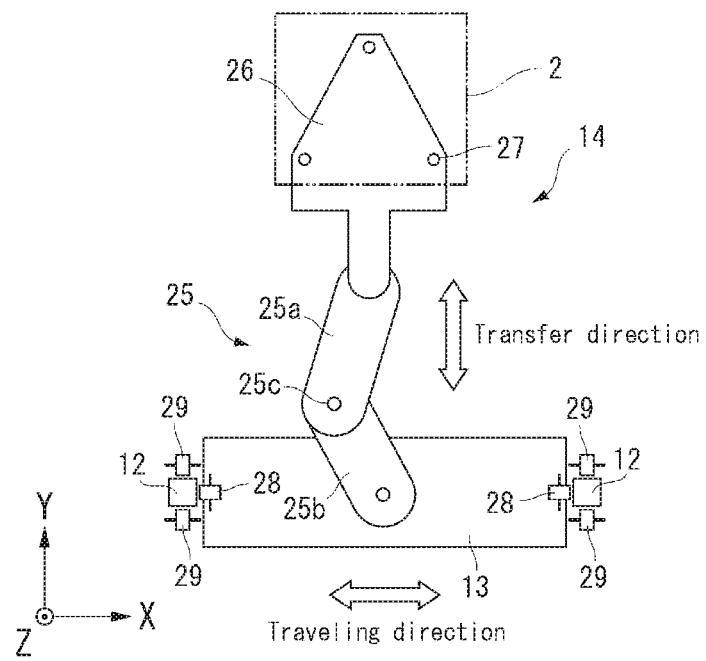
FIGS. 2A and 2B show examples of upper masts and mast guides, FIG. 2A being a diagram showing mast guides applied to cross-sectionally square-shaped upper masts, and FIG. 2B being a diagram showing the mast guides applied to the cross-sectionally rectangular-shaped upper masts in which rigidity thereof is enhanced in a transfer direction.
Figure 2B:
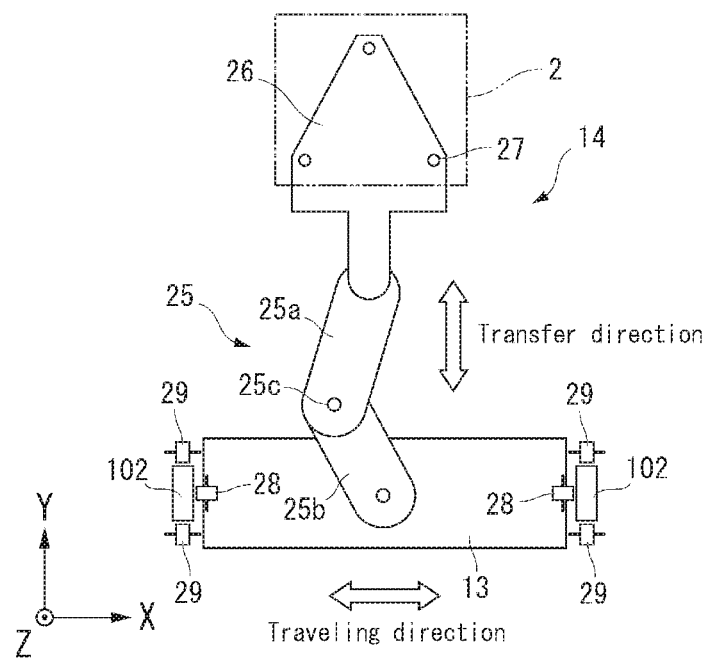

FIGS. 2A and 2B show examples of the upper masts 12 and mast guides 28, 29, FIG. 2A being a diagram showing the mast guides 28, 29 applied to the cross-sectionally square-shaped upper masts 12, and FIG. 2B being a diagram showing the mast guides 28, 29 applied to the cross-sectionally rectangular-shaped upper masts 102 in which rigidity thereof is enhanced in a transfer direction. The transferor 14 includes an arm assembly 25 and a holder 26. The arm assembly 25 includes arms 25a, 25b connected via a joint 25c. The arm assembly 25 can extend or retract in a horizontal direction including the Y direction as the arms 25a, 25b bend at the joint 25c. A proximal end side of the arm assembly 25 is connected to the elevation platform 13 and a distal end of the arm assembly 25 is connected to the holder 26. The holder 26 includes a plurality of (for example, three) pins 27 (for example, kinematic pins) used to position the article 2. The pins 27 respectively enter a plurality of grooves radially provided in the bottom surface of the article 2. The pins thus determine a precise position of the article 2 on the holder 26. Although FIGS. 2A and 2B show examples related to the upper masts 12, the lower masts 112 are the same as described above.

When the transferor 14 receives the article 2 from a transfer origin, the arm assembly 25 is extended in the direction of the article 2 positioned at the transfer origin, and the holder 26 is positioned below the bottom surface of the article 2. Then, in the transferor 14, the holder 26 picks up the article 2 as the elevation platform 13 ascends. Then, in the transferor 14, the arm assembly 25 is retracted with the article 2 still held on the holder 26, and the holder 26 is positioned on the elevation platform 13. When delivering the article 2 to a transfer destination, the transferor 14 determines a position at the transfer destination, extends the arm assembly 25, and positions the article 2 on the holder 26 above the transfer destination. Then, when the elevation platform 13 has been lowered, the transferor 14 delivers the article 2 to the transfer destination from the holder 26.

The transferor 14 shown in FIGS. 2A and 2B is merely an example, and may be of another configuration. For example, the transferor 14 may grasp a flange 2a provided on the upper portion of the article 2 (see FIG. 1A), or may sandwich sides of the article 2 to hold the article 2. The transferor 14 is not limited to using the arm assembly 25 described above, and for example, an articulated robot arm or the like may be used therefor.

Hereinafter, the direction in which the article 2 is moved when the transferor 14 performs transferring is referred to as a transfer direction where appropriate. As used herein, the expression "transfer direction" refers to the direction (the Y direction) in which the arm assembly 25 expands or retracts, and which is orthogonal to the traveling direction (the X direction) of the traveling body and is a horizontal direction. Furthermore, as shown in FIG. 2A, the elevation platform 13 includes the plurality of mast guides (28, 29). The mast guide 28 and the mast guide 29 are able to come in contact with the upper guide 12a (reference sign is omitted in FIGS. 2A and 2B) of the upper mast 12, and raise or lower the elevation platform 13 along the upper mast 12. Examples of the mast guide 28 and the mast guide 29 respectively include guide rollers.

The elevation platform 13 includes, at positions thereabove, the mast guides 28 respectively corresponding to the upper mast 12 on the +X side and the upper mast 12 on the −X side of the traveling direction of the traveling body 11. The elevation platform 13 is such that the X direction position of the movement path of the elevation platform 13 along the upper masts 12 is regulated by the mast guides 28. Since the mast guides 28 regulate the position of the upper mast 12 on the +X side and the position of the upper mast 12 on the −X side with respect to the elevation platform 13, the relative position of the elevation platform 13 in the X direction between the upper mast 12 on the +X side and the upper mast 12 on the −X side can be regulated at a predetermined position.

The mast guides 29 are provided at positions that sandwich each of the +X side upper mast 12 and the −X side upper mast 12 in the horizontal direction (the transfer direction) that is orthogonal to the traveling direction of the traveling body 11. Since the mast guides 28 prevent interference between the upper masts 12 and the elevation platform 13, the elevation platform 13 is able to smoothly ascend or descend. Furthermore, the mast guides 29 prevent the elevation platform 13 from being displaced from the position of the upper mast 12 in the transfer direction, and prevent the elevation platform 13 from deviating from the movement path along the upper masts 12. As a more preferable example, two of the mast guides 28 may be provided so as to sandwich each of the +X side upper mast 12 and the −X side upper mast 12. Thus, each upper mast 12 is brought into the state of being surrounded by the mast guide 28 and the mast guides 29, and this makes it possible to avoid the elevation platform 13 from deviating from the movement path along the upper mast 12. Although the upper masts 12 have been described above, the same applies to the lower masts 112.

FIG. 2B is a diagram showing an example in which upper masts 102 each having a shape different from that of the upper mast 12 shown in FIG. 2A are applied. Each upper mast 102 is orthogonal to the traveling direction of the traveling body 11 and the rigidity thereof in the horizontal direction (the transfer direction, the Y direction) is higher than the rigidity of the traveling body 11 in the traveling direction (the X direction). Here, the rigidity in the transfer direction is the rigidity with respect to the bending moment about an axis in the direction parallel to the X direction. The rigidity in the traveling direction is the rigidity with respect to the bending moment about an axis in the direction parallel to the Y direction. In FIG. 2B, the dimension of each upper mast 102 in the Y direction is greater than the size thereof in the X direction, and the rigidity thereof in the transfer direction is higher than the rigidity thereof in the traveling direction. When the upper masts 102 are used, the lower masts 112 also may each have a cross-sectional shape as shown in FIG. 2B.

The transferor 14 receives a moment about an axis parallel to the X direction in the state where the holder 26 is holding the article 2 and the arm assembly 25 is extended. This moment is transmitted to the upper masts 12 (including the lower masts 112) through the elevation platform 13. As shown in FIG. 2B, in the present preferred embodiment, since the rigidity of the upper masts 12 in the transfer direction is higher than the rigidity thereof in the traveling direction, the weight of the upper masts 102 (including the lower masts 112) is able to be reduced by reducing the rigidity thereof in the traveling direction, and also the upper masts 102 are able to withstand the bending moment arising from the rigidity in the transfer direction at the time of performing transferring.

Returning to the description of FIGS. 1A and 1B, the storage racks RL of FIG. 1B are arranged, for example, in a state of being lined up in the X direction with respect to the processing apparatus TL. The storage rack RL includes a plurality of rack plates RLa arranged in the vertical direction so that the transferor 14 is able to deliver or receive the article 2 to or from each of the plurality of rack plates RLa. The transferor 14 can also deliver or receive the article 2 to or from the load port LP of the processing apparatus TL. For example, the transferor 14 receives the article 2 from the storage rack RL and delivers the article 2 to the load port LP. Also, the transferor 14 receives the article 2 from the load port LP and delivers the article 2 to the storage rack RL. As in the case with the load port LP, the transferor 14 can also deliver or receive the article 2 to or from the buffer ST.

When the traveling body 11 is traveling, the weight of the overhead transport vehicle 3 supported by the ceiling 5 is greater than the weight thereof supported by the floor surface 6. For example, when the traveling body 11 is traveling, the overhead transport vehicle 3 is not in contact with the floor surface 6 (is in the state of being raised from the floor surface 6) and substantially the entire weight thereof is supported by the track 4, making the weight supported by the floor surface 6 almost zero. In the present preferred embodiment, when the traveling body 11 travels, driving force therefor is mainly supplied from the driving force of the traveling driver provided in an upper support portion on the upper side including the upper supporting body 17, and the traveling driver to supply a driving force to cause the traveling body 11 to travel is not provided in a lower support portion including the lower support body 20. Of the upper and lower supporting bodies, the lower support body 20 moves to follow the upper support body 17.

The overhead transport vehicle 3 of the present preferred embodiment includes fixtures 30. The fixtures 30 fix the upper masts 12 and the lower masts 112 to the floor surface 6 of the facility when the transferor 14 transfers an article. The fixtures 30 are anchors or the like provided on the lower support body 20 and are arranged respectively at both ends in the traveling direction (the X direction) of the lower support body 20, and the fixtures 30 are each capable of advancing or retreating (descending or ascending) to or from the floor surface 6. Furthermore, the overhead transport vehicle 3 includes a switch not shown in the drawings that switches the state of each fixture 30 between a state of being fixed to the lower mast 112 and a state of being released from the lower mast 112. The switch is attached to the lower support body 20 for example. The switch includes a drive source (for example, an electric motor, a cylinder device, or the like) to advance or retract the fixtures 30, and the state of being fixed and the state of being released described above are switched by driving the drive source.

When allowing the traveling body 11 to travel, the switch described above releases the fixed state of each fixture 30 and allows the lower mast 12 to follow the upper mast 12 in the traveling direction. When the traveling body 11 has been stopped, immediately after the lower mast 112 finished following the upper mast 12 (when a predetermined length of time has passed since the moment when the traveling body 11 stopped) or immediately after the traveling body 11 has stopped, the switch described above can fix the lower mast 112 (the lower portion of the lower mast 112) by the fixture 30. By fixing each lower mast 112 (the lower support body 20) by the fixture 30, the position of the elevation platform 13 relative to the transfer destination is determined. Therefore, fixing each lower mast 112 by the fixture 30 is to prepare to correct the position of the article 2 with respect to the transfer destination.

When the transferor 14 transfers the article, the switch causes each fixture 30 to advance toward the floor surface 6 and come in contact with the floor surface 6, to fix the lower support body 20 on the floor surface 6. In this manner, the lower portion of each lower mast 112 is connected to the lower support body 20, and accordingly, the lower mast 112, together with the lower support body 20, are fixed on the floor surface 6 by the fixture 30. As a result, the lower masts 112 and the lower support body 20, including the upper masts 12, are fixed to the traveling body 11 in the stop state.

In the overhead transport vehicle 3 described above, the upper masts 12 and the lower masts 112 are suspended from the traveling body 11. Therefore, when the fixtures 30 fix the lower portion of the lower masts 112 in the state where the upper masts 12 and the lower masts 112 are oscillating or vibrating after the traveling body 11 has stopped at a target position, the lower support body 20 may deviate from a target stop position in some cases. In such a case, in the overhead transport vehicle 3 of the present preferred embodiment, as an example, a detector not shown in the drawings detects the amount of deviation from the target stop position, and a corrector not shown in the drawings corrects the deviation amount. As a result, the position of the transfer destination with respect to the elevation platform 13 is corrected, and the transferor 14 is able to accurately transfer the article 2 to the target position (the transfer destination).

Figure 3:
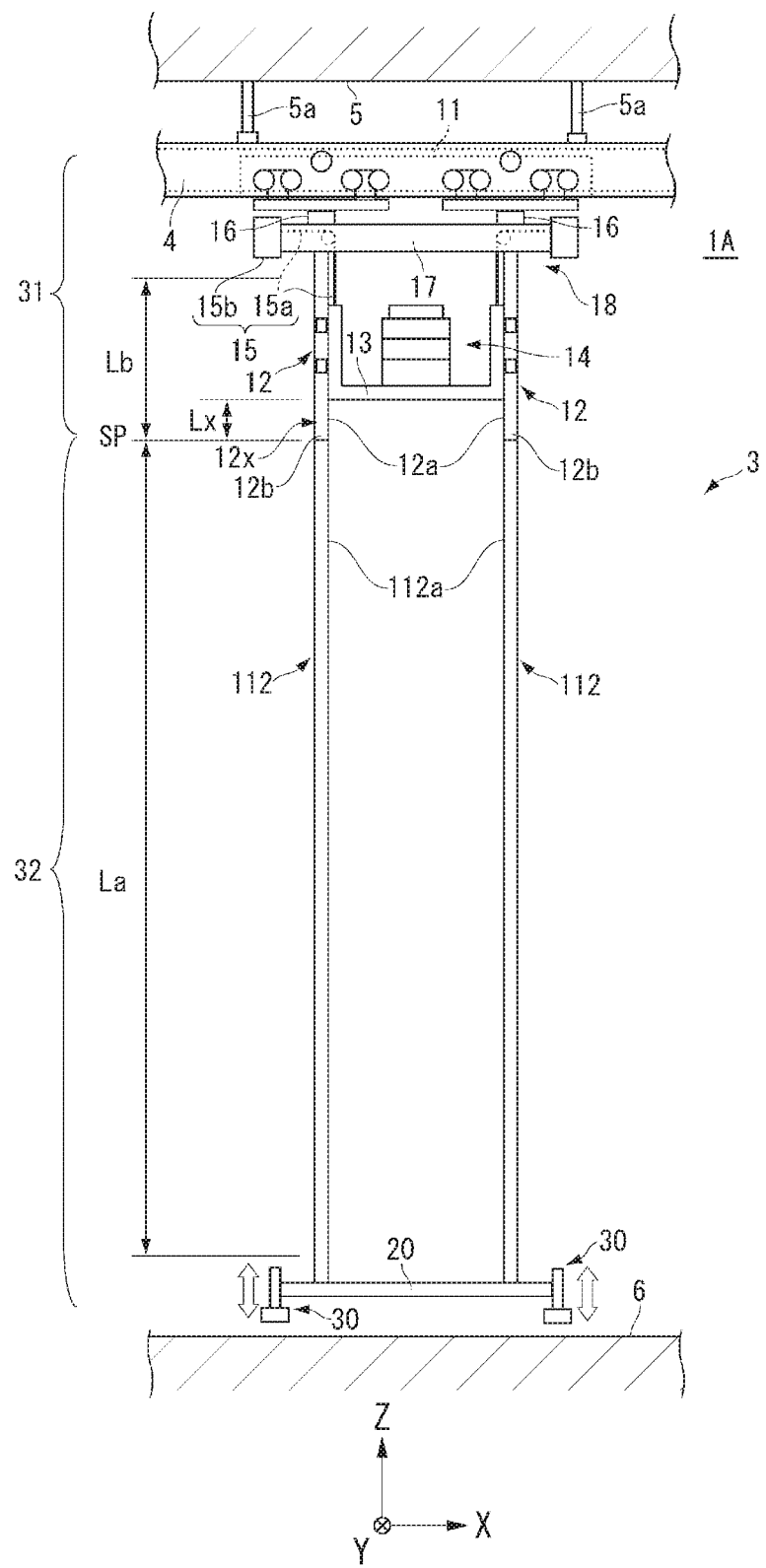
FIG. 3 is a diagram showing a state where the upper masts and the lower masts are separated from each other.

Next, a case where the lower masts 112 are separated from the upper masts 12 will be described. FIG. 3 is a diagram showing a state where the upper masts 12 and the lower masts 112 are separated from each other. In FIG. 3, reference sign La denotes a length of the lower side structure including the lower masts 112, and reference sign Lb denotes a length of the upper side structure including the upper masts 12. The length Lb of the upper side structure is shorter than the length La of the lower side structure. The upper masts 12 of the upper structure guide the elevation platform 13 to an upper limit of the movable range of the elevation platform 13 in the vertical direction.

In the following description, the traveling body 11, the upper masts 12, the elevation platform 13, the lift driver 15, and the transferor 14 are collectively referred to as an upper structure 31. The upper structure 31 includes structures of minimum requirements for a traveling operation, a raising/lowering operation, and a transferring operation. In the following description, the lower mast 112 and associated elements thereof (such as the lower support body 20) are expressed as a lower structure 32. In the overhead transport vehicle 3, the upper structure 31 and the lower structure 32 are separated from each other by separating the lower masts 112 from the upper masts 12.

When the elevation platform 13 ascends to a predetermined height or higher, the entire upper structure 31 is located above (on the +Z side of) a separation position SP at which the upper masts 12 and the lower masts 112 are separated from each other. For example, when the lift driver 15 winds up the suspenders 15a, the elevation platform 13 moves to the upper side of the lower structure 32. In this manner, the upper structure 31 is able to be consolidated above the separation position SP and is able to be easily separated from the lower structure 32. The upper structure 31 has various types of drivers consolidated therein and is able to be moved to another location by traveling of the traveling body 11.

As shown in FIG. 3, the lower end of the elevation platform 13 is the lower end of the element of the upper structure 31 except the upper masts 12. The separation position SP between the upper masts 12 and the lower masts 112 is below the lower end of the elevation platform 13. Therefore, in the upper structure 31, when the traveling body 11 travels in the traveling direction (the X direction), the elevation platform 13 does not interfere (collide) with the lower masts 112.

Also, in the upper structure 31, the shorter protruding portions 12x of the upper masts 12 protruding below the elevation platform 13 are, the lower the possibility of the portions 12x interfering (colliding) with other elements (such as the processing apparatus) will be when the traveling body 11 travels in the traveling direction (the X direction). Therefore, it is preferable that a length Lx of the portions 12x, that is, a dimension (height) from the lower end of the upper mast 12 (the separation position SP) to the lower end of the elevation platform 13 raised to the upper limit of the movable range thereof is made as short as possible. For example, the separation position SP is set to a position closest to the lower end of the elevation platform 13 within a range where a sufficient level of margin is ensured so that the mast guides 28, 29 of the elevation platform (see FIGS. 2A and 2B) do not depart from the upper masts 12. When a member that ascend or descend integrally with the elevation platform 13 is mounted and is arranged below elevation platform 13, the lower end position of the member may be used instead of the lower end of the elevation platform 13 to set the separation position SP.

Figure 4A:
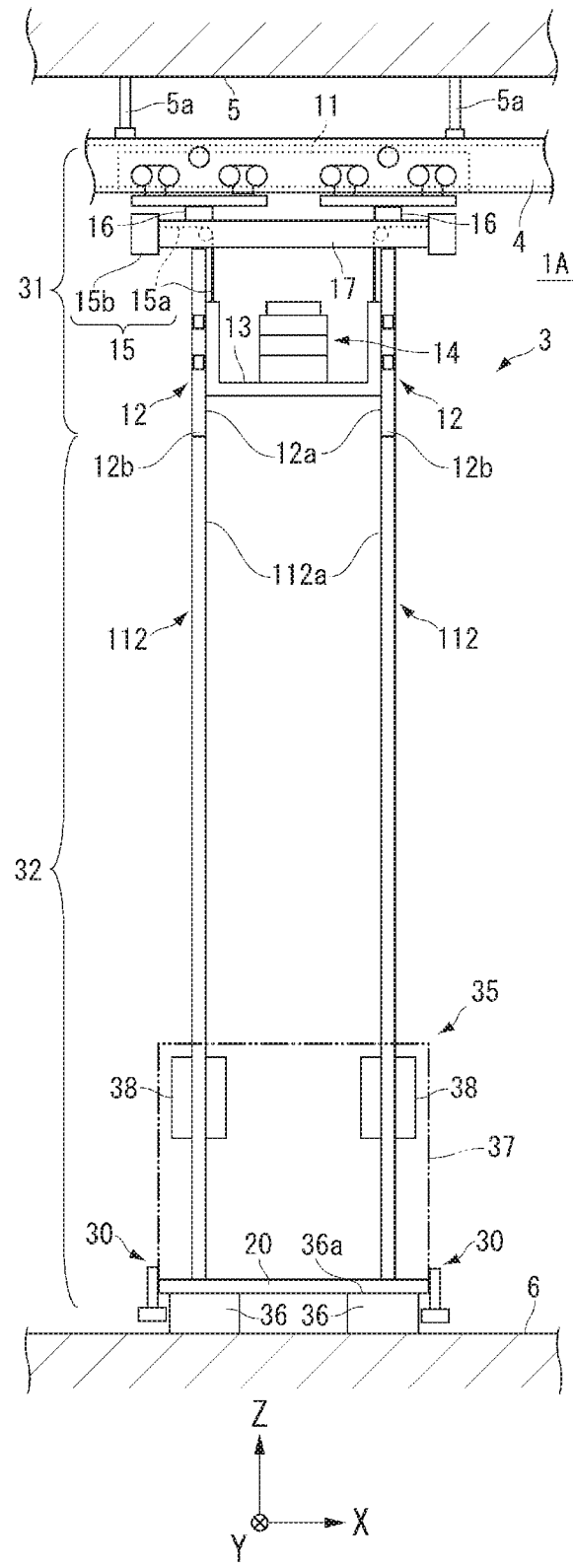
FIGS. 4A and 4B show examples of a support that supports the lower masts, FIG. 4A being a diagram including the support viewed from the Y direction, and FIG. 4B being a diagram including the support viewed from the X direction.
Figure 4B:
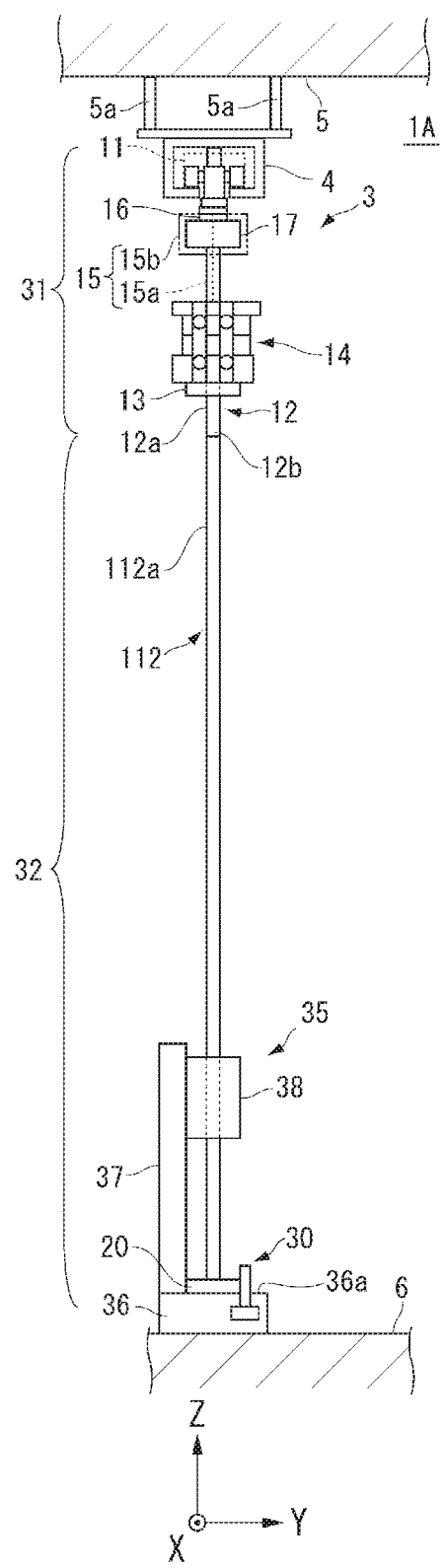

Separation between the upper masts 12 and the lower masts 112 described above is performed while the lower masts 112 are supported. The transport system 1A of the present preferred embodiment may include a support 35 that supports the lower masts 112 when separating the lower masts 112 from the upper masts 12. FIGS. 4A and 4B show examples of the support 35 that supports the lower masts 112, FIG. 4A being a diagram including the support 35 viewed from the Y direction, and FIG. 4B being a diagram including the support 35 viewed from the X direction. In the present preferred embodiment, as an example, the support 35 is arranged below the track 4 on which the traveling body 11 travels, in the facility where the overhead transport vehicle 3 is installed.

As shown in FIGS. 4A and 4B, the support 35 includes bases 36, a side structure 37, and mast holders 38. For example, in the present preferred embodiment, the bases 36 are installed on the floor surface 6 of the facility and are capable of supporting the lower support body 20 of the overhead transport vehicle 3. As an example of the present preferred embodiment, each base 36 is capable of moving the position of an upper surface 36a thereof in the vertical direction by a hydraulic or pneumatic cylinder device. The upper surface 36a of the base 36 moves upward in the state where the lower support body 20 is positioned thereabove, and comes in contact with the lower surface of the lower support body 20 to support the lower surface side of the lower support body 20.

The side structure 37 is installed on the bases 36 and extends upward at a side of the lower masts 112. The mast holders 38 are attached to the side structure 37. The mast holders 38 respectively grasp each of the lower masts 112 from the side thereof and holds the lower masts 112 so that they do not fall down. The configuration of the support 35 of this preferred embodiment as shown in FIGS. 4A and 4B is an example, and the configuration of the support 35 can be appropriately changed. The support 35 may be fixed at a predetermined position, or may include wheels or the like and be able to move to the lower side of the overhead transport vehicle 3 that is stopped on the track 4, for example.

Figure 5A:
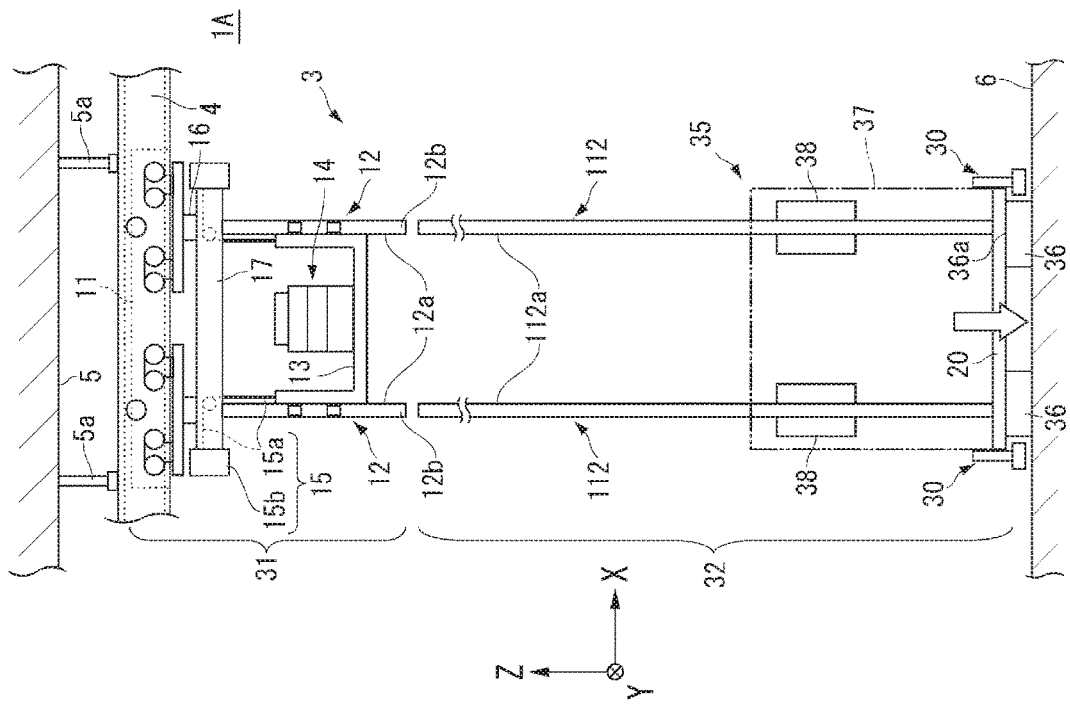
FIGS. 5A and 5B show an operation of separating the upper masts and the lower masts from each other, FIG. 5A being a diagram showing the state before separating the upper masts and the lower masts from each other, and FIG. 5B being a diagram showing the state after the upper masts and the lower masts have been separated from each other.
Figure 5B:
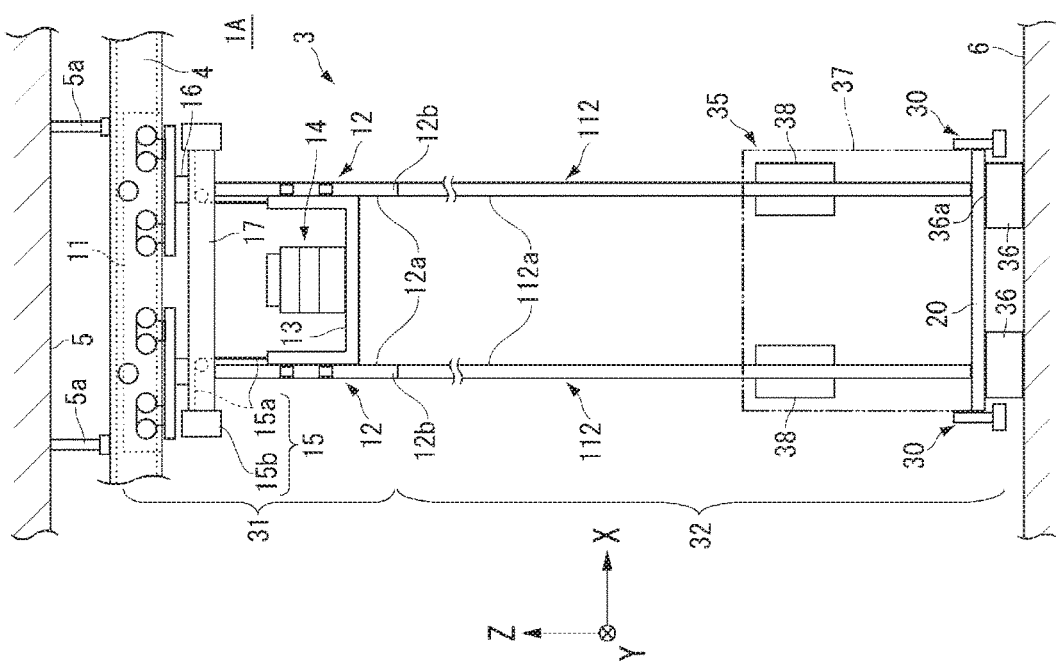

FIGS. 5A and 5B show an operation of separating the upper masts 12 and the lower masts 112 from each other, FIG. 5A being a diagram showing the state before separating the upper masts 12 and the lower masts 112 from each other, and FIG. 5B being a diagram showing the state after the upper masts 12 and the lower masts 112 have been separated from each other. The overhead transport vehicle 3 travels along the track 4 and stops above the support 35 (in a separation area), as shown in FIG. 5A. The support 35 then causes the upper surface 36a of each base 36 to rise to support the lower support body 20 of the overhead transport vehicle 3 from below. Furthermore, the support 35 supports each of the lower masts 112 from the side thereof by the mast holders 38. Then, the connections (fixations) between the upper masts 12 and the lower masts 112 are released manually or automatically, and thus the lower masts 112 are able to be separated from the upper masts 12.

Next, as shown in FIG. 5B, the support 35 causes the upper surface 36a of each base 36 to move downward. Thus, the lower masts 112 and associated constituents thereof (such as the lower support body 20) move downward and the lower masts 112 are separated from the connectors 12b of the upper masts 12. As a result, the upper structure 31 including the upper masts 12 can travel along the track 4 independently of the lower structure 32 including the lower masts 112. In other words, the overhead transport vehicle 3 (the traveling body 11) can travel in the state of having all of the configurations to raise or lower the elevation platform 13 consolidated on the upper masts 12 (in the upper structure 31). Whether or not the transport system 1A of the present preferred embodiment includes the support 35 described above is arbitrary and the support 35 may be omitted.

Figure 6:
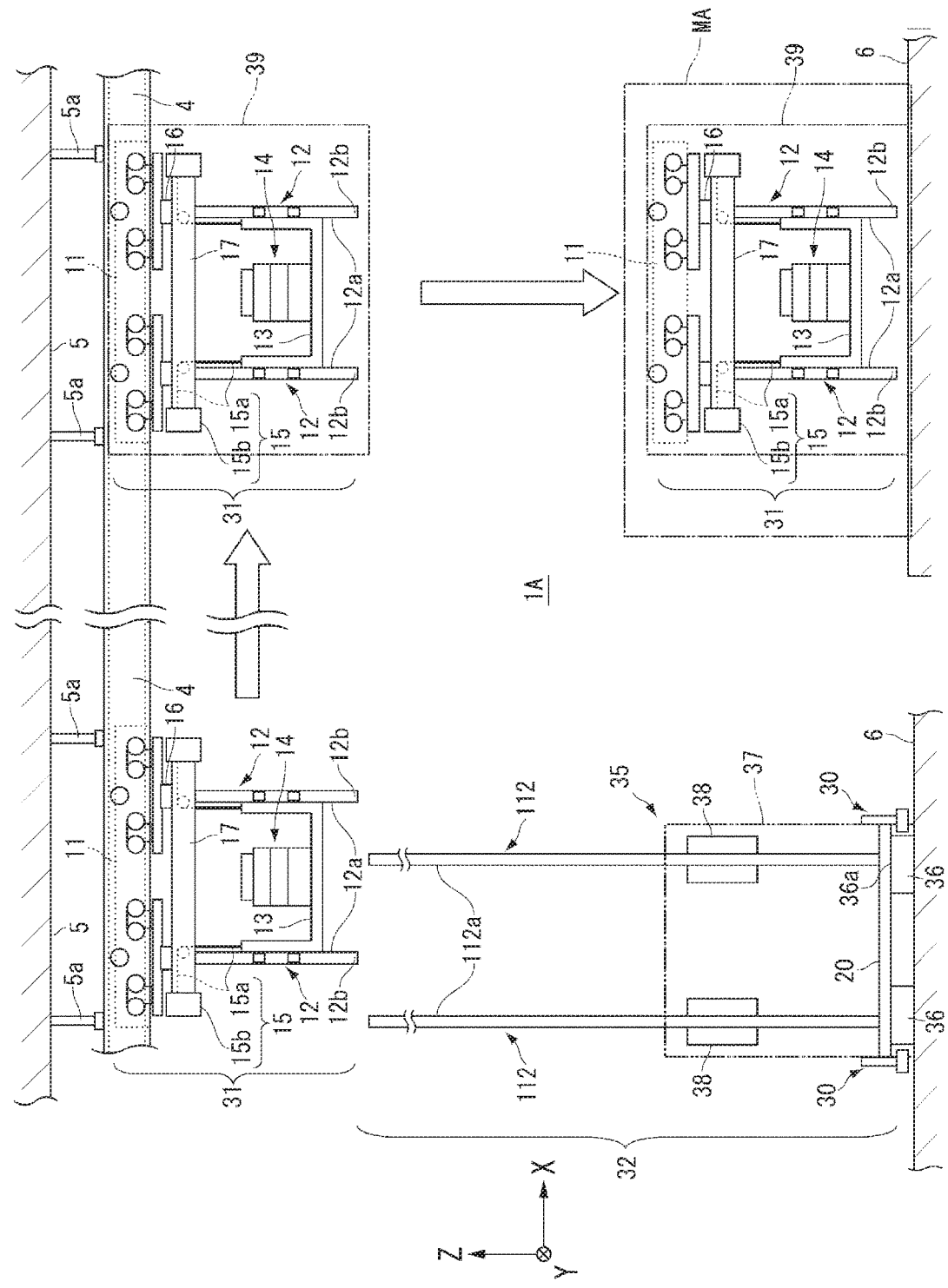
FIG. 6 is a diagram showing an example of an operation of a lifter.

In another example of the present preferred embodiment, the transport system 1A may include a lifter 39 to move the upper structure 31 separated from the lower structure 32 (the lower masts 112) in the vertical direction. FIG. 6 is a diagram showing an example of the lifter 39. As shown in FIG. 6, the lifter 39 is connected to the track 4, and is provided in a facility where the overhead transport vehicle 3 is installed. The upper structure 31 can be moved to a position of the lifter 39 by the traveling body 11 traveling on the track 4. The lifter 39 includes a lifting device or the like (not shown in the drawings), and is able to detach the upper structure 31 from the track 4 and move it in the vertical direction while holding the upper structure 31. For example, as an example of the present preferred embodiment, the lifter 39 may lower the upper structure 31 to a maintenance area MA provided on the floor surface 6 below the track 4. The upper structure 31 undergoes maintenance, inspection, repair, and so forth in the maintenance area MA.

The lifter 39 may lower the upper structure 31 from the track 4 and load it on a trolley or the like. The upper structure 31 loaded on the trolley may also be transported by the trolley to another location (for example, the maintenance area MA). The lifter 39 may hold, below the track 4, the upper structure 31, maintenance work on which has already been completed, or a spare upper structure 31, and may raise the upper structure 31 and may connect it to the track 4. The lifter 39 may be provided at a predetermined position, or may include a wheel or the like and be able to move, for example, to the position of the upper structure 31 that is stopped on the track 4. For example, in the case where the traveling body 11 is out of order, the upper structure 31 need not travel to the position of the lifter 39, and another device (for example, an overhead traveling vehicle) may tow and transport the upper structure 31 to the position of the lifter 39.

Figure 7:
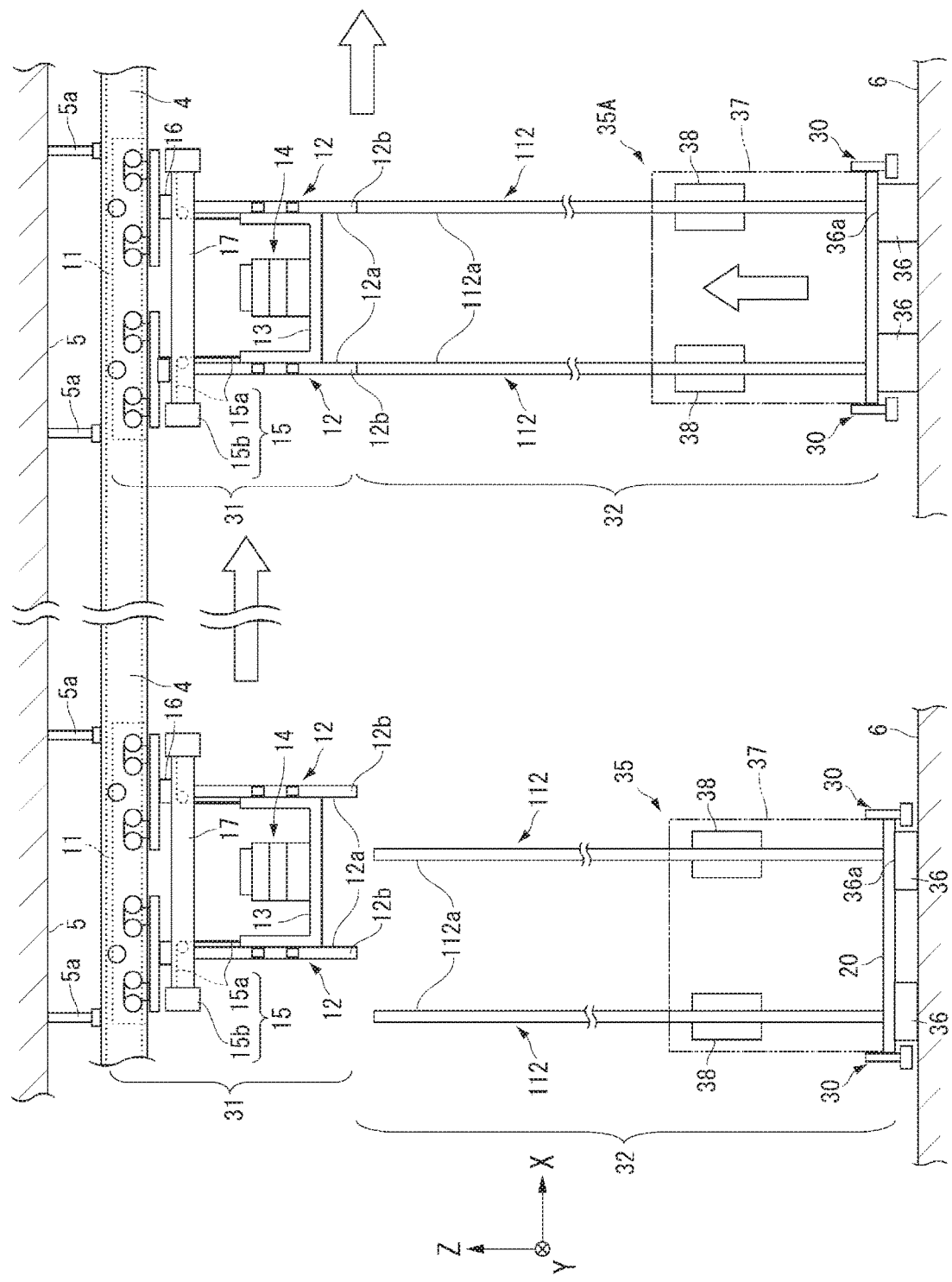
FIG. 7 is a diagram showing a state the upper masts having been replaced.

FIG. 7 is a diagram showing a state the upper masts 112 having been replaced. As shown in FIG. 7, after when the upper structure 31 has become able to move on the track 4 (see FIG. 5B), by moving the upper structure 31 to the upper side of the lower masts 112 (the lower structure 32) held by another support 35A and moving the bases 36 upward, it is possible to connect other lower masts 112 to the connectors 12b of the upper masts 12. As a result, the overhead transport vehicle 3 can attach, at a different position, the lower structure 32 separate from the lower structure that has separated earlier. The length in the vertical direction of the lower mast 112 supported by the support 35A is the same as the length of the lower masts 112 that has been detached earlier. In this configuration, by detaching the lower masts 112 from the connectors 12b of the upper masts 12, it is possible to easily replace the lower masts 112 with other same lower masts 112 (lower structure 32) that are arranged separately.

Second Preferred Embodiment

Figure 8:
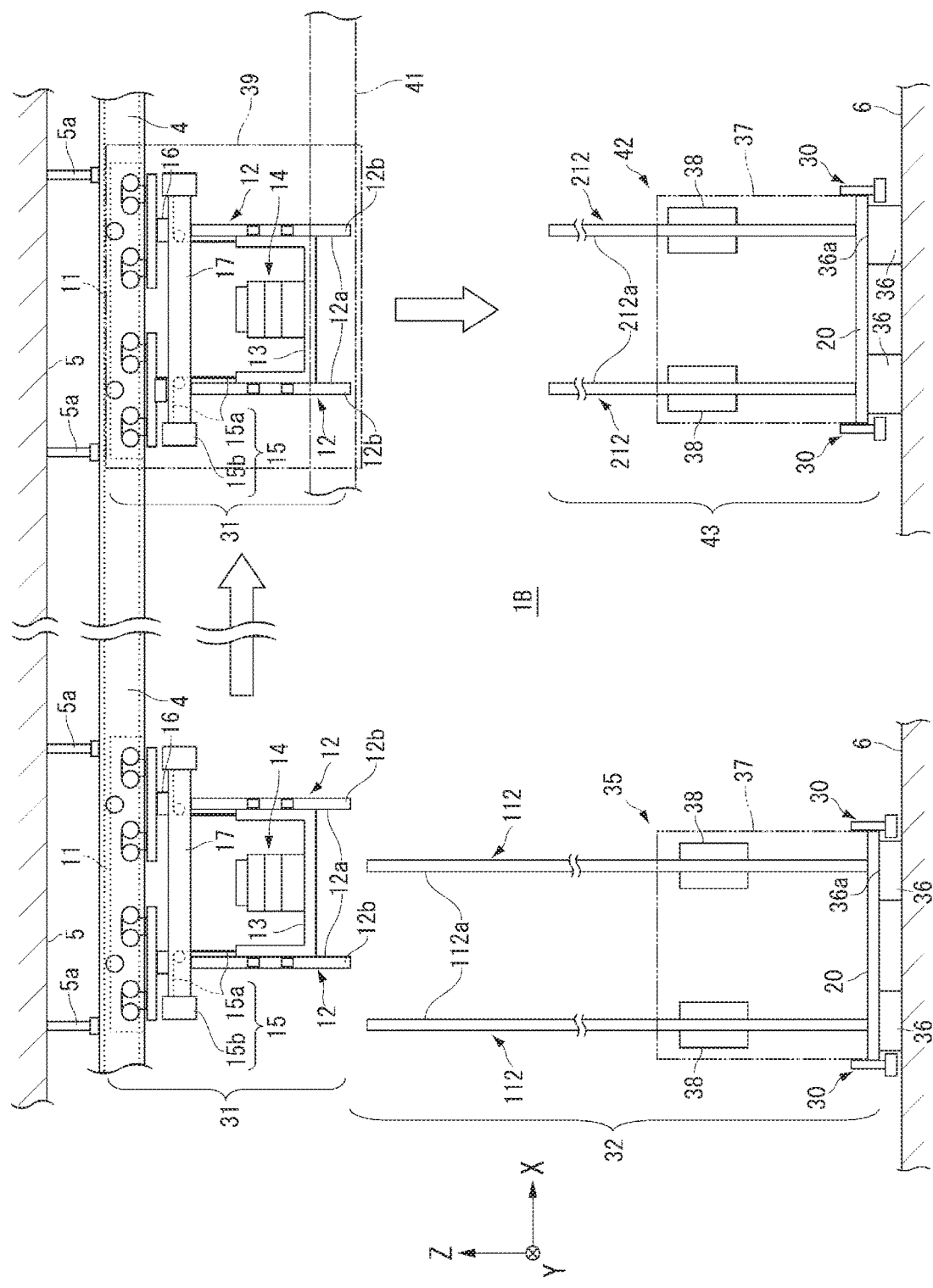
FIG. 8 is a diagram showing an example of an overhead transport vehicle and a transport system related to a second preferred embodiment of the present invention.
Figure 9:
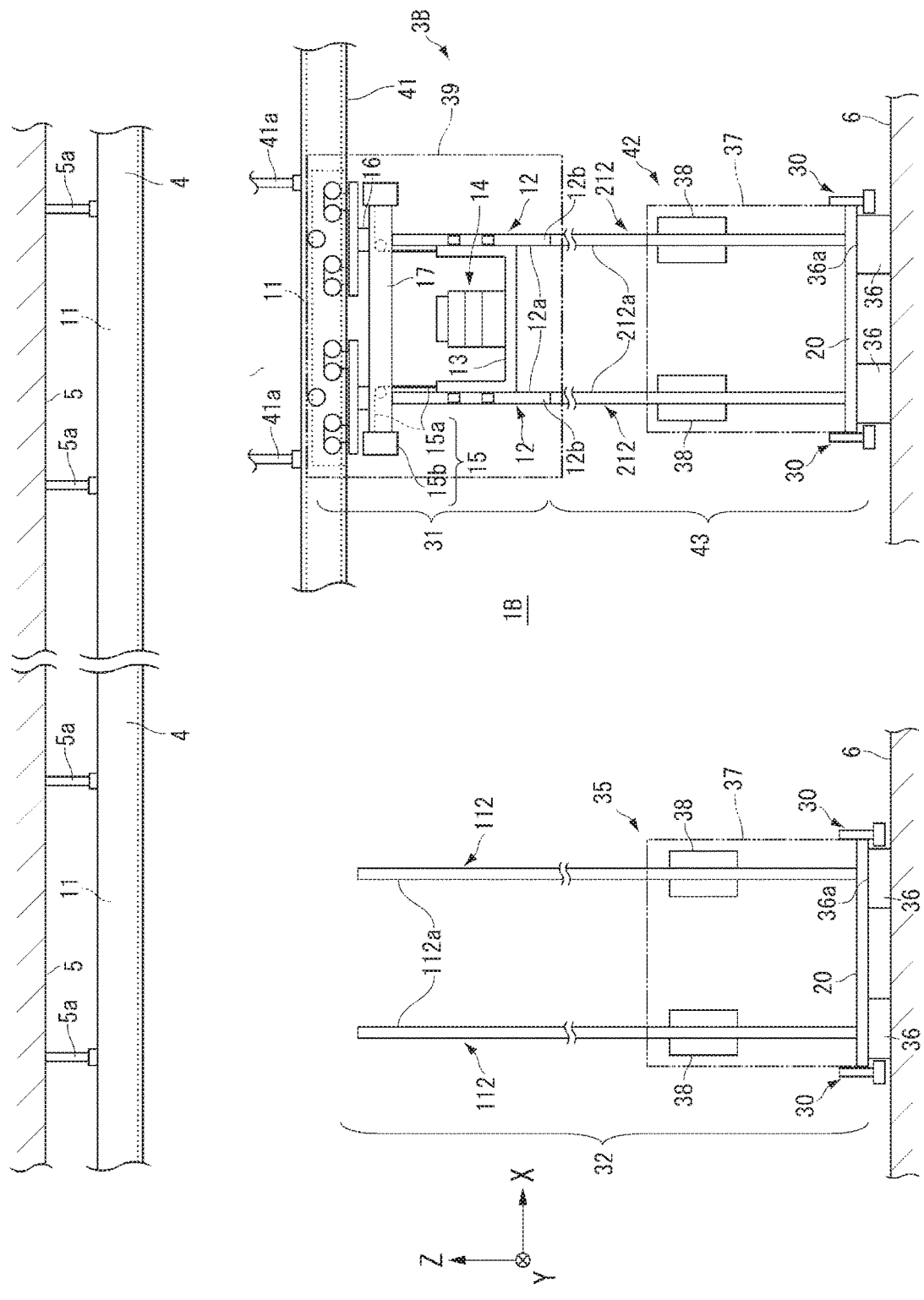
FIG. 9 is a diagram showing an operation of the transport system related to the second preferred embodiment of the present invention.
Figure 10:
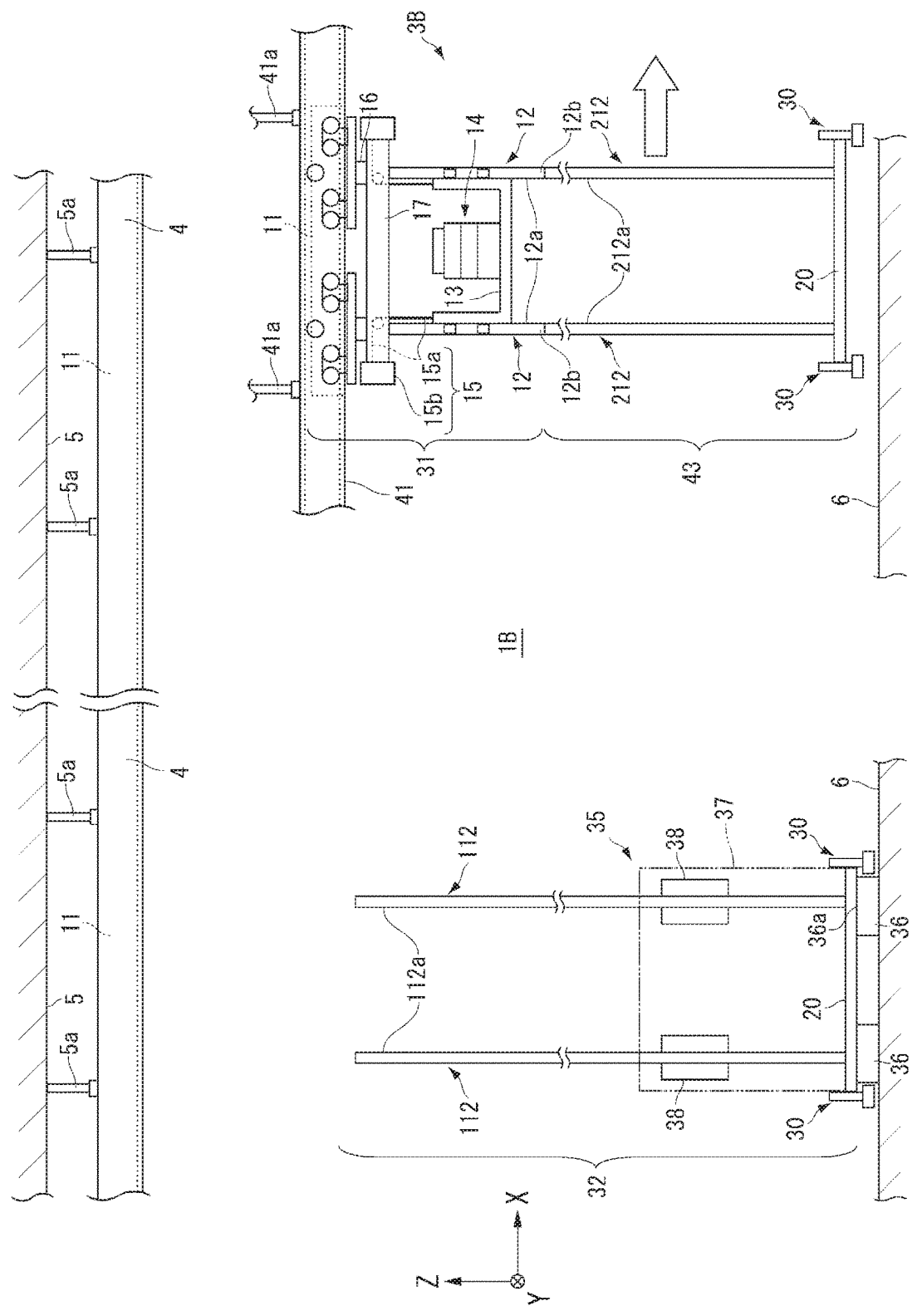
FIG. 10 is a diagram showing an operation of the transport system related to the second preferred embodiment of the present invention, following the operation of FIG. 9.

Hereunder, a second preferred embodiment of the present invention is described. In the present preferred embodiment, similar members as those described above are assigned with the same symbols and the descriptions thereof are omitted or simplified. FIG. 8 is a diagram showing an example of a transport system 1B to which an overhead transport vehicle related to the present preferred embodiment is applied. FIG. 9 and FIG. 10 are diagrams each showing an operation of the transport system 1B related to the present preferred embodiment.

The transport system 1B of the present preferred embodiment includes a track 41, lower masts 212 different in length from the lower masts 112 described above, and a support 42. As with the track 4, the track 41 allows the traveling body 11 to travel thereon. The track 41 is provided at a height from the floor surface 6 different from that height of the track 4 and is arranged below the track 4 in FIG. 8. As with the track 4, the track 41 may be attached to the ceiling 5 of the facility via the metal hangers 5a, or may be attached to a pedestal located on the floor surface 6 of the facility. As with the lower masts 112 described above, the lower masts 212 are able to be connected to the connectors 12b of the upper masts 12 similarly. Each lower mast 212 differs from the lower mast 112 described above in length in the longitudinal direction, and includes a lower guide 212a that continues to the upper guide 12a of the upper mast 12. In FIG. 8, the length of each lower mast 212 in the longitudinal direction is shorter than that of the lower mast 112 described above, and the upper end of the lower mast 212 is arranged below the upper end of the lower mast 112 described above.

The lifter 39 is provided, for example, at a position where the track 4 and the track 41 come in close proximity of each other, and the support 42 is arranged below the lifter 39. The support 42 holds a lower structure 43 including the lower masts 212. The lower structure 43 is the same as the lower structure 32 described above except for the length of the lower mast 212.

As shown in the figure on the left side of FIG. 8, after the overhead transport vehicle 3 has been separated into the upper structure 31 and the lower structure 32, the upper structure 31 moves to the position of the lifter 39. The lifter 39 moves downward while holding the upper structure 31. The horizontal positions of the upper masts 12 and the lower masts 212 of the upper structure 31 are preliminarily determined. Therefore, as a result of the upper structure 31 having moved downward, as shown in FIG. 9, the upper end of each lower mast 212 is connected to the connector 12b of the upper mast 12, and the connector 12b and the upper end of each lower mast 212 are fixed. Thus, the upper structure 31 and the lower structure 43 define the overhead transport vehicle 3B.

As shown in FIG. 10, after the lifter 39 and the support 35 in FIG. 9 have retreated, the overhead transport vehicle 3B is able to travel along the track 41 and transfer articles. The overhead transport vehicle 3B differs from the overhead transport vehicle 3 (see FIG. 5A) in the movable range of the elevation platform 13. In the configuration of the present preferred embodiment, the upper structure 31 including the upper masts 12 can be commonly used when operating either one of the overhead transport vehicles 3 and 3B according to the height and so forth of the transfer destination.

Figure 11:
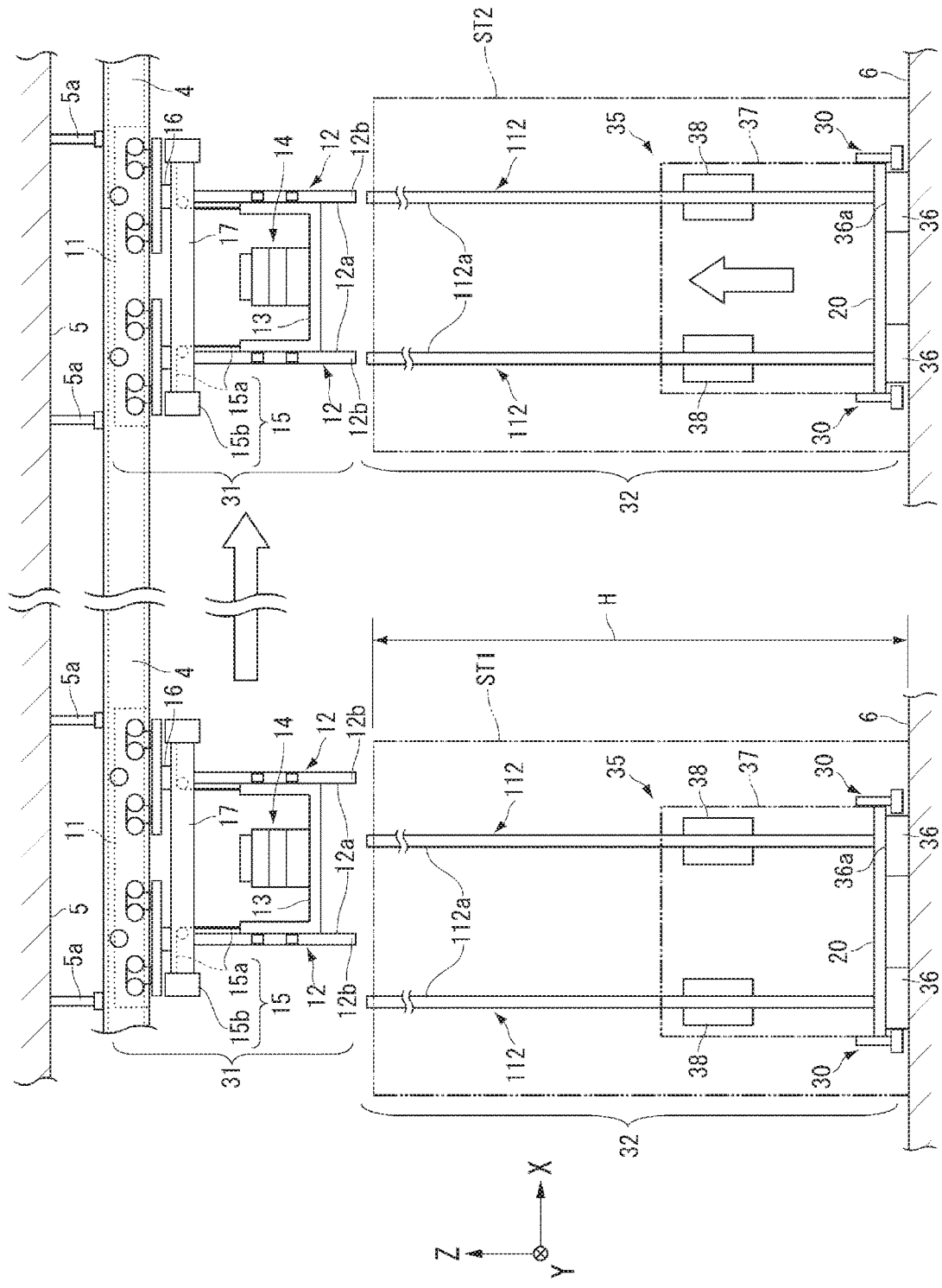
FIG. 11 is a diagram showing an example in which the upper masts, the elevation platform, and the transferor have moved from one storage to another storage.

FIG. 11 is a diagram showing an example in which the upper structure 31 has moved from a storage (stocker) ST1 to another storage ST2. As shown in FIG. 11, the overhead transport vehicle 3 is used to transfer articles within the storage ST1. The storage ST1 includes a plurality of accommodating racks arranged vertically and horizontally within a space surrounded by side walls and so forth, and transfers the article 2 placed at an accommodating rack, an incoming/outgoing port, or the like, by the overhead transport vehicle 3. When a height H of the side walls of the storage ST1 is lower than the lower end of the upper mast 12, the upper structure 31 separated from the lower structure 32 is able to pass above the side walls of the storage ST1. As a result, the upper structure 31 is able to move along the track 4 to move to the other storage ST2.

In the storage ST2, the lower structure 32 of the overhead transport vehicle 3 is preliminarily prepared. By connecting the upper masts 12 to the lower masts 112 of the lower structure 32, the upper structure 31 provides the overhead transport vehicle 3 within the storage ST2. In the case where a plurality of storages are arranged along the track 4, by preliminarily preparing the lower structure 32 in each storage, it is possible to move the upper structure 32 to any one of the storages and connect it to the lower structure 32 prepared in that storage, and it is possible to provide, within that storage, the overhead transport vehicle 3 to transfer the articles 2.

Therefore, the function of the overhead transport vehicle 3 is able to be ensured in the plurality of storages by the upper structures 31, the number of which is less than that of the storages. Since it is sufficient for each storage to only have the lower structure 31 prepared therein, a cost reduction is able to be achieved. Although FIG. 11 shows the example of the upper structure 31 moving above the side walls of the storage ST1, but the upper structure 31 is also able to move above the processing apparatus TL and so forth.

Third Preferred Embodiment

Figure 12:
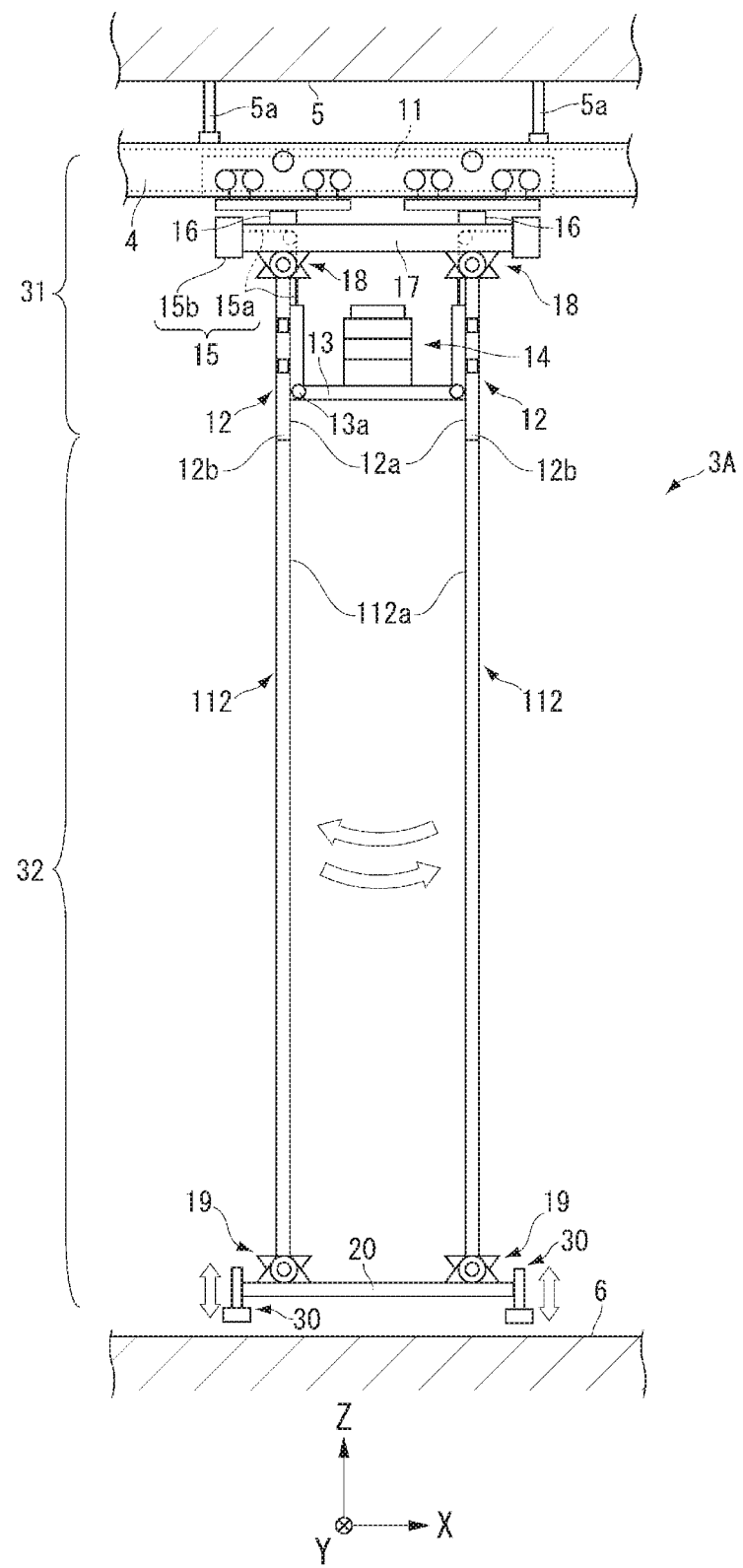
FIG. 12 is a diagram showing an example of an overhead transport vehicle related to a third preferred embodiment of the present invention.

A third preferred embodiment of the present invention is described. FIG. 12 is a diagram showing an example of an overhead transport vehicle 3A related to the third preferred embodiment. In the present preferred embodiment, similar members as those described above are assigned with the same symbols and the descriptions thereof are omitted or simplified. As shown in FIG. 12, in the overhead transport vehicle 3A, the upper masts 12 are attached to the upper support body 17 via connectors 18. Each connector 18 is, for example, a hinge, and has a horizontal direction (Y direction) axis center orthogonal to the traveling direction (the X direction) of the traveling body 11. Each connector 18 transmits almost no moment about the axis center thereof when friction is ignored. The traveling body 11 supports the upper masts 12 by the connectors 18 each having a mechanism capable of rotating (freely rotating) about the axis center.

The connectors 18 each receive a moment about two directions (the X direction and the Z direction) perpendicular or substantially perpendicular to the axis center. Therefore, each connector 18 prevents the upper mast 12, the longitudinal direction of which is arranged in the vertical direction (the Z direction), from tilting toward the side (the −Y side or the +Y side) of the track 4. Also, each connector 18 prevents the upper mast 12 from twisting about the vertical direction (the Z direction) when the traveling body 11 travels. Although each connector 18 includes a hinge as an example, the present invention is not limited thereto, and a mechanism, such as a universal joint, capable of rotating about a plurality of axis centers (extending in the X direction and the Y direction, for example) may be used.

The lower ends of lower masts 112 are connected to the lower support body 20 via connectors 19. Each connector 19 is, for example, a hinge, and has a horizontal direction (Y direction) axis center orthogonal to the traveling direction (the X direction) of the traveling body 11. Each connector 19 transmits almost no moment about the axis center thereof when influence of friction is eliminated. Each connector 19 connects the lower support body 20 and the lower mast 112 in such a configuration as to support the lower support body 20 and the lower mast 112 while allowing them to rotate (freely rotate) about the axis center.

As with the connectors 18, the connectors 19 each receive a moment about two directions (the X direction and the Z direction) perpendicular or substantially perpendicular to the axis center. Also, each connector 19 prevents, by the lower support body 20, the lower mast 112 from twisting about the vertical direction (the Z direction). Although each connector 19 includes a hinge as an example, the present invention is not limited thereto, and a mechanism, such as a universal joint, capable of rotating about a plurality of axis centers (extending in the X direction and the Y direction, for example) may be used.

In the overhead transport vehicle 3A shown in FIG. 12, when the traveling body 11 accelerates or decelerates, the upper masts 12 and the lower masts 112 integrally rotate and tilt in directions indicated by the arrows due to the inertial force of the lower support 20 side. However, since the lower support body 20 is able to rotate about the axis center of each connector 19 of the lower mast 112, the lower support body 20 remains in the state of being horizontal even when the lower masts 112 tilt. Also, since the lower support body 20 moves behind or ahead of the position below the upper support body 17, the overhead transport vehicle 3A has a parallelogram shape when the traveling body 11 accelerates or decelerates. However, the lower support body 20 can still remain in the state of being horizontal at the time of accelerating as well as decelerating.

As shown in FIG. 12, the elevation platform 13 is provided by connecting side structures and a bottom structure via hinges 13a. The hinges 13a rotatably connects the side structures and the bottom structure of the elevation platform 13. Therefore, even when the upper masts 12 or the lower masts 112 oscillate, the side structures rotate together with the upper masts 12 or the lower masts 112, and thus the bottom structure of the elevation platform 13 is able to be maintained horizontal.

As described above, according to the overhead transport vehicles 3, 3A, 3B and the transport systems 1A, 1B of the present preferred embodiment, it is possible to easily change the ascending/descending range of the elevation platform 13 by connecting the lower masts 112, 212 to the upper masts 12. Furthermore, the lift driver 15 is supported by the traveling body 11 even when the lower masts 112 are separated from the upper masts 12. Therefore, the upper structure 31 and the lower structure 32 are able to be separated by a simple operation such as removal of the lower masts 112, 212 from the upper masts 12. Since the upper masts 12, the elevation platform 13, and the lift driver 15 are supported in a compact form by the traveling body 11, the upper masts 12, the elevation platform 13, and the lift driver 15 are able to be easily moved to another location along with the traveling body 11 after having been separated from the lower masts 112.

Various preferred embodiments of the present invention have been described above. However, the technical scope of the present invention is not limited to the mode described in the above preferred embodiments. One or more of the requirements described in the above preferred embodiments may be omitted in some cases. Also, one or more of the requirements described in the above preferred embodiments may be combined where appropriate. Furthermore, the contents of Japanese Patent Application No. 2016-204184, Japanese Patent Application No. 2016-204185 and all documents cited in the detailed description of the present invention are incorporated herein by reference to the extent permitted by law.

In the above preferred embodiments, the track 4 is provided on the ceiling 5 of the facility via the metal hangers 5a, however, it may be provided directly on the ceiling 5, for example, and it may also be provided on a frame (pedestal) or the like located in the vicinity of the ceiling 5.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
a track provided on a ceiling side of a facility;
an overhead transport vehicle including:
a traveling body that travels on the track;
an upper mast attached to a lower side of the traveling body and including an upper guide;
an elevation platform on which an article is placed, and which is guided by the upper guide to ascend or descend along the upper mast;
a lift driver that is provided on the traveling body or on the elevation platform and that drives the elevation platform to ascend or descend;
a lower mast that is connected to a lower end of the upper mast via a connector in a freely detachable manner, and that includes a lower guide extending to the upper guide; and
a fixture to fix the upper mast and the lower mast to a floor surface of the facility when the article is transferred to or from the elevation platform; and
a support that supports the lower mast when the lower mast is being disconnected from the upper mast; wherein
the support includes a base installed on the floor surface of the facility;
the support includes a mast holder that grasps the lower mast from a side of the lower mast; and
the lift driver of the overhead transport vehicle is structured to lower the elevation platform along the lower mast from the upper mast.

2. The transport system according to claim 1, wherein a lower end position of the upper mast is lower than a lower end of the elevation platform positioned at an upper limit of a movable range thereof.

3. The transport system according to claim 1, wherein the lower mast connected to the upper mast and a member attached to the lower mast are not in contact with a floor surface side of the facility when the traveling body is traveling.

4. The transport system according to claim 1, wherein the elevation platform includes a plurality of mast guides for the elevation platform to ascend or descend along the upper mast or the lower mast.

5. The transport system according to claim 1, further comprising a transferor that is provided on the elevation platform and that transfers the article.

6. The transport system according to claim 1, further comprising a second lower mast that is connected to the lower end of the upper mast via a connector in a freely detachable manner, that includes a lower guide extending to the upper guide, and that has a length different from that of the lower mast.

7. A transport system comprising:
a track provided on a ceiling side of a facility;
an overhead transport vehicle including:
a traveling body that travels on the track;
an upper mast attached to a lower side of the traveling body and including an upper guide;
an elevation platform on which an article is placed, and which is guided by the upper guide to ascend or descend along the upper mast;
a lift driver that is provided on the traveling body or on the elevation platform and that drives the elevation platform to ascend or descend; and a lower mast that is connected to a lower end of the upper mast via a connector in a freely detachable manner, and that includes a lower guide extending to the upper guide; and a lifter that is connectable to the track and that causes the overhead transport vehicle having been disconnected from the lower mast to move in a vertical direction;

wherein the lift driver of the overhead transport vehicle is structured to lower the elevation platform along the lower mast from the upper mast; and the lifter vertically moves the overhead transport vehicle when the overhead transport vehicle is disconnected from the lower mast with the elevation platform supported by the upper mast.

8. The transport system according to claim 7, further comprising a second lower mast that is connected to the lower end of the upper mast via a connector in a freely detachable manner, that includes a lower guide extending to the upper guide, and that has a length different from that of the lower mast.

9. The transport system according to claim 7, wherein a lower end position of the upper mast is lower than a lower end of the elevation platform positioned at an upper limit of a movable range thereof.

10. The transport system according to claim 7, wherein the lower mast connected to the upper mast and a member attached to the lower mast are not in contact with a floor surface side of the facility when the traveling body is traveling.

11. The transport system according to claim 7, wherein the elevation platform includes a plurality of mast guides for the elevation platform to ascend or descend along the upper mast or the lower mast.

12. The transport system according to claim 7, further comprising a transferor that is provided on the elevation platform and that transfers the article.

* * * * *